United States Patent
Ohno et al.

(10) Patent No.: US 7,837,804 B2
(45) Date of Patent: Nov. 23, 2010

(54) SUBSTRATE CLEANING METHOD, SUBSTRATE CLEANING EQUIPMENT, COMPUTER PROGRAM, AND PROGRAM RECORDING MEDIUM

(75) Inventors: Hiroki Ohno, Nirasaki (JP); Kenji Sekiguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1054 days.

(21) Appl. No.: 10/594,549

(22) PCT Filed: Apr. 19, 2005

(86) PCT No.: PCT/JP2005/007450

§ 371 (c)(1),
(2), (4) Date: Sep. 27, 2006

(87) PCT Pub. No.: WO2005/104200

PCT Pub. Date: Nov. 3, 2005

(65) Prior Publication Data

US 2008/0251101 A1 Oct. 16, 2008

(30) Foreign Application Priority Data

Apr. 23, 2004 (JP) .............................. 2004-128764

(51) Int. Cl.
*B08B 7/04* (2006.01)
(52) U.S. Cl. .............................. 134/33; 134/18; 134/21; 134/25.1; 134/25.4; 134/26; 134/30; 134/31; 134/32; 134/34; 134/36; 134/37; 134/42; 134/902; 34/60; 34/222; 34/443; 34/487; 34/488
(58) Field of Classification Search .................... 134/18, 134/21, 25.1, 25.4, 26, 30, 31, 32, 33, 34, 134/36, 37, 42, 902; 34/60, 222, 443, 487, 34/488
See application file for complete search history.

(56) References Cited

U.S. PATENT DOCUMENTS 5,882,433 A * 3/1999 Ueno .......................... 134/31

(Continued)

FOREIGN PATENT DOCUMENTS

JP 10-172951 6/1998

(Continued)

OTHER PUBLICATIONS

Office Action (Application No. 200580012831.X).

*Primary Examiner*—Sharidan Carrillo
(74) *Attorney, Agent, or Firm*—Smith, Gambrell & Russell, LLP

(57) ABSTRACT

In a dry process after a cleaning process using a cleaning-liquid nozzle and a rinse process using a side rinse nozzle are performed on a wafer W, the wafer W is turned, feeding of pure water to a center point of the wafer W from a pure-water nozzle is started, and substantially at the same, injection of a nitrogen gas from a gas nozzle to a center portion of the wafer W at a point at an adequate distance apart from the center of the wafer W is started. Next, while the pure-water nozzle is caused to scan toward the periphery of the wafer W, the gas nozzle is caused to scan toward the periphery of the wafer W in an area radially inward of the position of the pure-water nozzle after the gas nozzle passes the center of the wafer W.

19 Claims, 7 Drawing Sheets

U.S. PATENT DOCUMENTS

| | | | |
|---|---|---|---|
| 5,939,139 A | 8/1999 | Fujimoto | |
| 5,997,653 A | 12/1999 | Yamasaka | |
| 6,334,902 B1 * | 1/2002 | Mertens et al. | 134/1 |
| 6,770,151 B1 * | 8/2004 | Ravkin et al. | 134/33 |
| 2003/0022515 A1 * | 1/2003 | Nakagawa | 438/734 |
| 2003/0079764 A1 * | 5/2003 | Hirose et al. | 134/95.3 |
| 2003/0192577 A1 * | 10/2003 | Thakur et al. | 134/146 |
| 2004/0040177 A1 * | 3/2004 | Izumi | 34/492 |
| 2004/0074526 A1 * | 4/2004 | Aoki et al. | 134/36 |
| 2006/0048792 A1 * | 3/2006 | Nakamura et al. | 134/2 |
| 2006/0081269 A1 * | 4/2006 | Kim et al. | 134/2 |
| 2006/0266389 A1 * | 11/2006 | Thakur et al. | 134/94.1 |
| 2008/0251101 A1 * | 10/2008 | Ohno et al. | 134/4 |

FOREIGN PATENT DOCUMENTS

| | | | |
|---|---|---|---|
| JP | 10-209143 | | 8/1998 |
| JP | 2001-35824 | | 2/2001 |
| JP | 2001-053051 | | 2/2001 |
| JP | 2002-57088 | | 2/2002 |
| JP | 2002-057088 | * | 2/2002 |
| JP | 2004-111857 | | 4/2004 |

\* cited by examiner

SUBSTRATE CLEANING METHOD, SUBSTRATE CLEANING EQUIPMENT, COMPUTER PROGRAM, AND PROGRAM RECORDING MEDIUM

TECHNICAL FIELD

The present invention relates to a substrate cleaning method and a substrate cleaning apparatus which are capable of suppressing generation of water marks on the surface of a substrate to be processed, such as a semiconductor wafer or a glass substrate for FPD (Flat Panel Display), a computer program for allowing the substrate cleaning apparatus to execute the substrate cleaning method, and a program recording medium which has the computer program recorded therein.

BACKGROUND ART

In a semiconductor device fabrication process, for example, as the surface of a semiconductor wafer should always be kept clean, a cleaning process is performed on the semiconductor wafer adequately. As a typical example of a single wafer type cleaning process of processing semiconductor wafers one by one, a process method is known which performs a cleaning process by feeding a predetermined chemical liquid to a semiconductor wafer held by a spin chuck or causing a rotary brush to abut on the surface of a semiconductor wafer, then performs a rinse process of feeding pure water to the semiconductor wafer, and then further rotates the semiconductor wafer at a high speed to spin the pure water off the semiconductor wafer.

However, such a process method has a problem such that micro water residue remains on the surface of the semiconductor wafer, which appears as water marks. When the surface of the semiconductor wafer which is not completely dried is in contact with air, that portion is oxidized, generating water marks.

As a method which suppresses generation of such water marks, Unexamined Japanese Patent Application Publication No. 2001-53051 discloses a substrate dry method which sprays an inactive gas to the center portion of a substrate after a rinse process, sprays pure water to the outer peripheral portion of the substrate, and moves the spray position of the inactive gas and the spray position of the pure water outward from the substrate in the radial direction.

The method disclosed in the publication does not however achieve sufficient reduction of water marks at the circumferential portion of a substrate to be processed. As an inactive gas is fed after pure water is moved off the center of the substrate, water marks are likely to be generated in the center portion of the substrate. In this respect, there is demands for a substrate cleaning method and a substrate cleaning apparatus which can further suppress generation of water marks.

DISCLOSURE OF INVENTION

The present invention has been made in view of the above situations, and aims at providing a substrate cleaning method and a substrate cleaning apparatus which can suppress generation of water marks, a computer program for allowing the substrate cleaning apparatus to execute the substrate cleaning method, and a program storage medium which has the computer program recorded therein.

According to a first aspect of the invention, there is provided a substrate cleaning method which performs a cleaning process and a dry process on a target substrate, the dry process comprising the steps of:

rotating the target substrate in an approximately horizontal state, and starting feeding a rinse liquid to a center of a surface of the target substrate;

starting feeding an inactive gas to a point at an adequate distance apart from the center of the target substrate in a vicinity of the center of the target substrate; and moving a gas feed point for supply of the inactive gas to the target substrate toward the center of the target substrate while moving a rinse-liquid feed point for supply of the rinse liquid to the target substrate, and then moving the gas feed point toward a periphery from the center of the target substrate in an area located radially inward of the rinse-liquid feed point.

In the substrate cleaning method according to the first aspect, it is preferable that feeding the inactive gas to the point at the adequate distance apart from the center of the target substrate in the vicinity of the center of the target substrate should be started substantially at a same time as initiation of feeding the rinse liquid to the center of the surface of the target substrate.

According to a second aspect of the invention, there is provided a substrate cleaning method which performs a cleaning process and a dry process on a target substrate, the dry process including the steps of:

rotating the target substrate in an approximately horizontal state, and feeding a rinse liquid while moving a feed point thereof from a center of a surface of the target substrate toward a periphery thereof;

feeding an inactive gas in such a way that a gas feed point thereof moves from a center portion of the target substrate toward the periphery thereof in an area located radially inward of the rinse-liquid feed point;

stopping feeding the rinse liquid after the rinse-liquid feed point comes off an end face of the target substrate; and stopping feeding the inactive gas after the inactive-gas feed point comes off the end face of the target substrate, and then setting a number of rotations of the target substrate greater than a number of rotations of the target substrate at a time of feeding the inactive gas.

In the substrate cleaning methods according to the first and second aspects, it is preferable that a moving speed of the gas feed point to which the inactive gas is fed should be made faster at a circumferential portion of the target substrate than at a center portion thereof. It is preferable that a rinse process which feeds the rinse liquid to a predetermined point of the surface of the target substrate for a predetermined time while rotating the target substrate in an approximately horizontal state should be provided between the cleaning process and the dry process, and a number of rotations of the target substrate at a time of feeding the inactive gas should be set greater than a number of rotations of the target substrate at a time of the rinse process. Further, with such a rinse process provided, an amount of the rinse liquid to be fed to the surface of the target substrate at a time of the dry process should be made less than that at a time of the rinse process. Furthermore, with such a rinse process provided, a film of the rinse liquid should be formed on the surface of the target substrate before initiation of the dry process.

In the substrate cleaning method, it is preferable that after the rinse-liquid feed point comes off the periphery of the target substrate, the gas feed point should be stopped near a circumferential portion of the target substrate for a predetermined time, thereby drying the circumferential portion of the target substrate. Further, it is preferable that in the step of moving the rinse-liquid feed point and the gas feed point in the dry process, a direction in which the gas feed point moves from the center of the target substrate to the periphery thereof should be shifted from a direction in which the rinse-liquid feed point moves from the center of the target substrate to the periphery thereof. This can lead to an improvement or so of the degree of freedom of the speeds of moving the rinse-liquid feed point and the gas feed point. The invention is suitably used when the surface of the target substrate is hydrophobic.

According to a third aspect of the invention, there is provided a substrate cleaning apparatus which performs a cleaning process and a dry process on a target substrate, and comprises:

a spin chuck which holds the target substrate and rotates the target substrate in an approximately horizontal state;

a cleaning mechanism which performs a predetermined cleaning process on the target substrate held by the spin chuck;

a rinse nozzle which feeds a rinse liquid to the target substrate held by the spin chuck;

a gas nozzle which feeds an inactive gas to the target substrate held by the spin chuck; and a nozzle control apparatus which causes the rinse nozzle to scan the target substrate from a center thereof to a periphery thereof while spraying the rinse liquid from the rinse nozzle, causes the gas nozzle to scan the target substrate from near a center portion thereof to the center thereof while injecting the inactive gas from the gas nozzle, and then causes the gas nozzle to scan the target substrate toward the periphery thereof in an area located radially inward of a position of the rinse nozzle.

In the substrate cleaning apparatus, it is preferable that the nozzle control apparatus should cause the gas nozzle to scan faster at a circumferential portion of the target substrate than at the center portion thereof. It is also preferable that the nozzle control apparatus should be so configured as to cause the rinse nozzle and the gas nozzle to perform scanning with a direction of causing the rinse nozzle to perform scanning from the center of the target substrate to the periphery thereof being shifted from a direction causing the gas nozzle to perform scanning from the center of the target substrate to the periphery thereof. This can improve the degree of freedom of speed control of the rinse nozzle and the gas nozzle while avoiding collision thereof.

According to the invention, there is provided a computer program which is used in controlling the substrate cleaning apparatus to execute the substrate cleaning method. That is, according to a fourth aspect of the invention, there is provided a computer program including software which runs on a computer and controls a substrate cleaning apparatus in such a way as to clean a target substrate by executing a process of drying the target substrate by, when execute, (a) rotating the target substrate undergone a cleaning process, and starting feeding a rinse liquid to a center of a surface of the target substrate, (b) starting feeding an inactive gas to a point at an adequate distance apart from the center of the target substrate in a vicinity of the center of the target substrate, and (c) moving a gas feed point for supply of the inactive gas to the target substrate toward the center of the target substrate while moving a rinse-liquid feed point for supply of the rinse liquid to the target substrate, and then moving the gas feed point toward a periphery from the center of the target substrate in an area located radially inward of the rinse-liquid feed point.

According to a fifth aspect of the invention, there is provided a computer program including software which runs on a computer and controls a substrate cleaning apparatus in such a way as to clean a target substrate by executing a process of drying the target substrate by, when execute, (a) rotating the target substrate undergone a cleaning process in an approximately horizontal state, and feeding a rinse liquid while moving a feed point thereof from a center of a surface of the target substrate toward a periphery thereof, (b) feeding an inactive gas in such a way that a gas feed point thereof moves from a center portion of the target substrate toward the periphery thereof in an area located radially inward of the rinse-liquid feed point, (c) stopping feeding the rinse liquid after the rinse-liquid feed point comes off an end face of the target substrate, and (d) stopping feeding the inactive gas after the inactive-gas feed point comes off the end face of the target substrate, and then setting a number of rotations of the target substrate greater than a number of rotations of the target substrate at a time of feeding the inactive gas.

Further, the invention provides a computer readable storage medium having each of computer programs according to the fourth and fifth aspects recorded therein. That is, according to a sixth aspect of the invention, there is provided a computer readable storage medium having recorded software for allowing a computer to run a control program which controls a substrate cleaning apparatus in such a way as to clean a target substrate by executing a process of drying the target substrate by, when execute, (a) rotating the target substrate undergone a cleaning process, and starting feeding a rinse liquid to a center of a surface of the target substrate, (b) starting feeding an inactive gas to a point at an adequate distance apart from the center of the target substrate in a vicinity of the center of the target substrate, and (c) moving a gas feed point for supply of the inactive gas to the target substrate toward the center of the target substrate while moving a rinse-liquid feed point for supply of the rinse liquid to the target substrate, and then moving the gas feed point toward a periphery from the center of the target substrate in an area located radially inward of the rinse-liquid feed point.

According to a seventh aspect of the invention, there is provided a computer readable storage medium having recorded software for allowing a computer to run a control program which controls a substrate cleaning apparatus in such a way as to clean a target substrate by executing a process of drying the target substrate by, when execute, (a) rotating the target substrate undergone a cleaning process in an approximately horizontal state, and feeding a rinse liquid while moving a feed point thereof from a center of a surface of the target substrate toward a periphery thereof, (b) feeding an inactive gas in such a way that a gas feed point thereof moves from a center portion of the target substrate toward the periphery thereof in an area located radially inward of the rinse-liquid feed point, (c) stopping feeding the rinse liquid after the rinse-liquid feed point comes off an end face of the target substrate, and (d) stopping feeding the inactive gas after the inactive-gas feed point comes off the end face of the target substrate, and then setting a number of rotations of the target substrate greater than a number of rotations of the target substrate at a time of feeding the inactive gas.

According to the invention, as an inactive gas is fed in real time to a portion where a film of a rinse liquid is gone at the time of a dry process, oxidization of the surface of the substrate is suppressed, thereby suppressing generation of water marks. The invention also brings about an effect of shortening the time required for a cleaning process of a single target substrate.

BEST MODE FOR CARRYING OUT THE INVENTION

Figure 1:
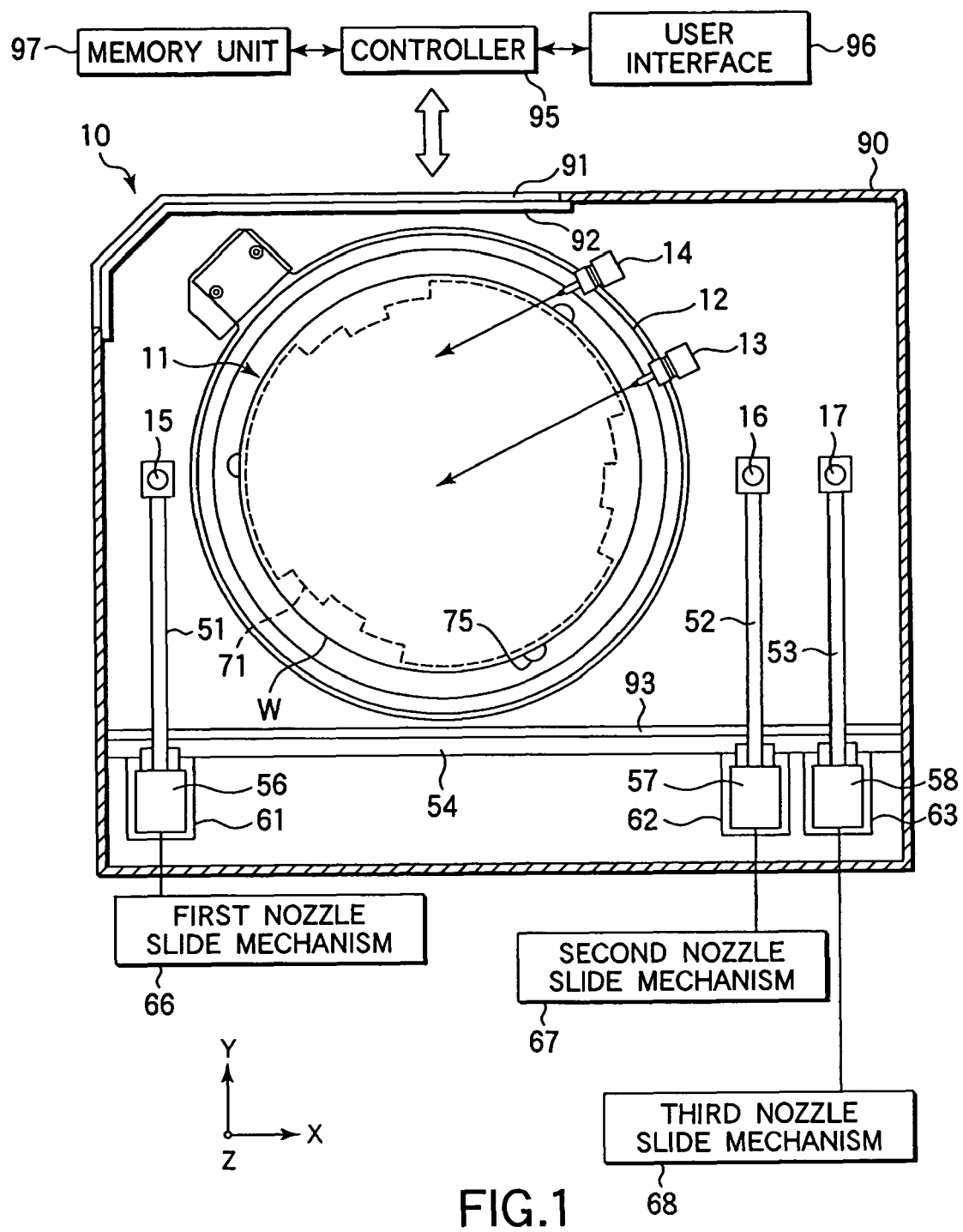
[FIG. 1] A plan view showing the schematic structure of a cleaning apparatus.
Figure 2:
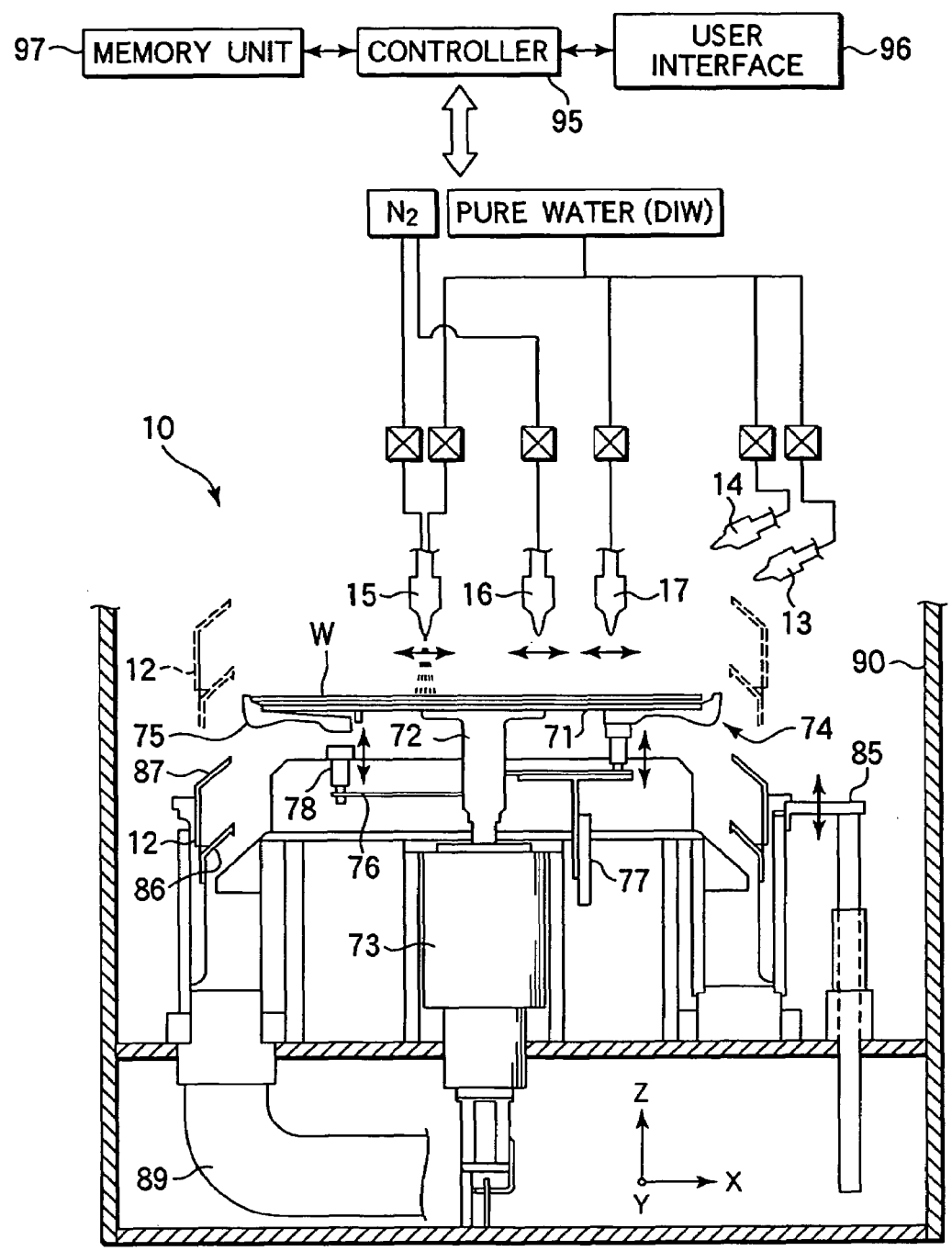
[FIG. 2] A Z-X cross-sectional view of the cleaning apparatus shown in FIG. 1.
Figure 3:
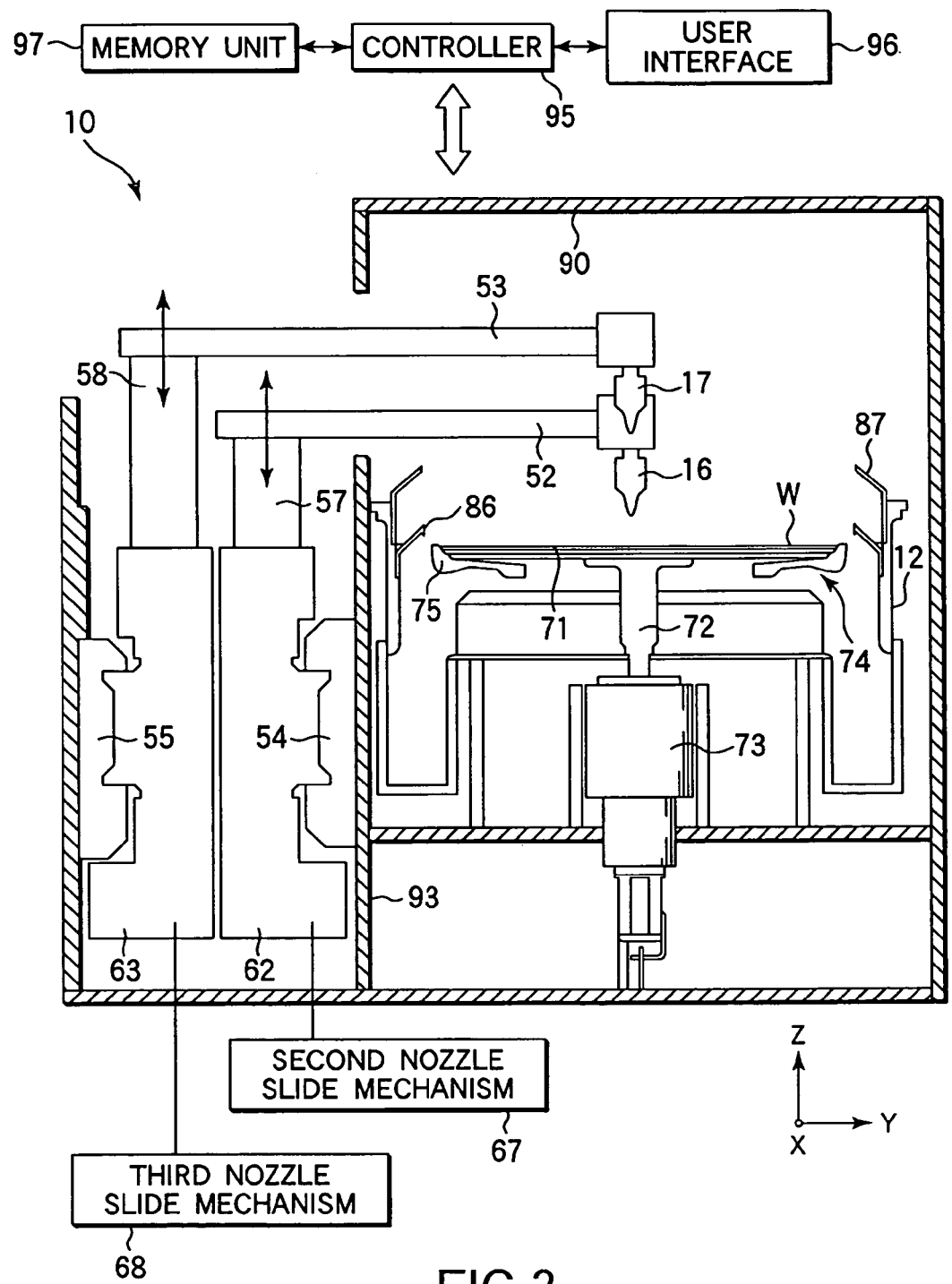
[FIG. 3] A Y-Z cross-sectional view of the cleaning apparatus shown in FIG. 1.

An embodiment of the present invention will be described in detail below with reference to the accompanying drawings, taking a substrate cleaning apparatus which performs a cleaning process on a semiconductor wafer as an example. FIG. 1 presents a plan view showing the schematic structure of a cleaning apparatus 10, FIG. 2 presents a Z-X cross-sectional view of the cleaning apparatus 10, and FIG. 3 presents a Y-Z cross-sectional view of the cleaning apparatus 10.

The cleaning apparatus 10 is configured to have individual members laid out in a housing 90. A window 91 is formed in one side face of the housing 90, and is openable and closable by a shutter 92. A wafer W is transferred into and out through the window 91. The interior of the housing 90 is partitioned into two chambers by a partition wall 93, one of which is a liquid process chamber where a cleaning liquid or pure water or the like is handled while the other one is a mechanism layout room for layout of a drive mechanism for moving various nozzles and the like for a cleaning process.

The cleaning apparatus 10 includes a spin chuck 11 which holds a wafer W in an approximately horizontal state, a cup 12 which surrounds the wafer W held by the spin chuck 11, two side rinse nozzles 13, 14 fixed to predetermined positions outside the cup 12 for feeding a rinse liquid (pure water (DIW)) to the surface of the wafer W, a cleaning-liquid nozzle 15 which feeds a cleaning liquid to the surface of the wafer W, a pure-water nozzle 17 which feeds a pure water (DIW) to the surface of the wafer W, and a gas nozzle 16 which feeds an inactive gas, e.g., a nitrogen gas, to the surface of the wafer W.

The spin chuck 11 has a chuck plate 71, a pivot 72 which supports the chuck plate 71, a motor 73 which rotates the pivot 72, and a chuck/dechuck mechanism 74 which holds/releases a wafer W mounted on the chuck plate 71. A plurality of unillustrated support pins are laid out on the surface of the chuck plate 71 to support the wafer W.

The chuck/dechuck mechanism 74 has holding members 75 provided at the periphery of the chuck plate 71 at three locations thereof, a plate member 76 provided under the chuck plate 71, a lift mechanism 77 which lifts the plate member 76 up and down, and abutment jigs 78 provided on the plate member 76 in association with the layout positions of the holding members 75. FIG. 2 shows, on the left side, the holding member 75 holding a wafer W, and FIG. 2 shows, on the right side, the holding member 75 not holding the wafer W.

The chuck/dechuck mechanism 74 moves the holding members 75 using the principle of leverage to switch between the state of holding a wafer W and a release state. That is, as the lift mechanism 77 is moved up, the abutment jigs 78 laid out at three locations respectively press the inner circumferential ends of the holding members 75 against the back of the chuck plate 71, causing the outer circumferential ends of the holding members 75 to move outward and downward to release the wafer-W holding state. As the lift mechanism 77 is moved downward to disengage the abutment jigs 78 from the holding members 75, on the other hand, the outer circumferential ends of the holding members 75 move inward and upward and abut on the edge of the wafer W, thereby applying force directed toward the center from the circumferential portion of the wafer W so that the wafer W is held by the holding members 75.

The cup 12 can be lifted up and down by a lift mechanism 85. FIG. 2 shows both a lower level position (solid line) and an upper level position (broken line), while FIG. 3 shows only the upper level position. The cup 12 is held at the lower level position when the wafer W is transferred into or out, and is held at the upper level position during a cleaning process. Two tapered portions 86, 87 inclined from the upper inner circumferential portion toward the lower outer circumferential portion are formed on the cup 12 in up and down stages. An exhaust duct 89 is provided in the bottom of the cup 12.

The side rinse nozzle 13 sprays pure water toward nearly the center of the wafer W, and the side rinse nozzle 14 sprays pure water toward a point outward of the center of the wafer W. This can ensure formation of a uniform liquid film over the entire wafer W with a smaller amount of pure water. It is preferable that the side rinse nozzles 13, 14 be arranged so that the cleaning liquids are sprayed nearly in parallel from the side rinse nozzles 13, 14, which facilitates formation of a more uniform liquid film.

A nitrogen gas and pure water are fed to the cleaning-liquid nozzle 15 respectively from a nitrogen-gas source and a pure-water source, and are mixed inside the cleaning-liquid nozzle 15. A resulting cleaning liquid which has the nitrogen gas mixed in the pure water (hereinafter called "2-fluid cleaning liquid") is sprayed onto the surface of the wafer W. Of course, the cleaning liquid is not limited to this type, and a structure which sprays various chemical solutions may be employed. Note that the cleaning-liquid nozzle 15 can spray only pure water if the supply of the nitrogen gas is stopped, and can inject only the nitrogen gas if the supply of the pure water is stopped.

The cleaning-liquid nozzle 15 is held on a first nozzle arm 51 which can be lifted up and down by a first arm lift mechanism 56. The first arm lift mechanism 56 is attached to a slider 61 movably fitted to a guide 54 extending in an X direction in the mechanism layout room, and X-directional position control of the slider 61 is carried out by a first nozzle slide mechanism 66. For example, an electromagnetic linear motor, a ball screw mechanism or the like is used as the first nozzle slide mechanism 66. Such a structure can allow the cleaning-liquid nozzle 15 to scan over the wafer W in the X direction, and to retreat outside the cup 12 beyond the upper end of the cup 12.

The gas nozzle 16 which feeds a nitrogen gas to the surface of the wafer W is held on a second nozzle arm 52 which can be lifted up and down by a second arm lift mechanism 57. The second arm lift mechanism 57 is attached to a slider 62 movably fitted to the guide 54 extending in the X direction in the mechanism layout room, and X-directional position control of the slider 62 is carried out by a second nozzle slide mechanism 67. The same drive type as the first nozzle slide mechanism 66 is suitably used as the second nozzle slide mechanism 67. Such a structure can also allow the gas nozzle 16 to scan over the wafer W in the X direction, and to retreat outside the cup 12 beyond the upper end of the cup 12.

The pure-water nozzle 17 which feeds pure water to the surface of the wafer W is held on a third nozzle arm 53 which can be lifted up and down by a third arm lift mechanism 58. The third arm lift mechanism 58 is attached to a slider 63 movably fitted to the guide 54, and X-directional position control of the slider 63 is carried out by a third nozzle slide mechanism 68. The same drive type as the first nozzle slide mechanism 66 is suitably used as the third nozzle slide mechanism 68. Such a structure can also allow the pure-water nozzle 17 to scan over the wafer W in the X direction, and to retreat outside the cup 12 beyond the upper end of the cup 12.

A controller 95 executes drive control of various mechanisms provided in the thus configured cleaning apparatus 10, and control of valves which control fluid supply to various nozzles from the sources for the nitrogen gas and pure water. That is, the individual components of the cleaning apparatus 10 are so structured as to be connected to the controller (process controller) 95 and controlled thereby. Connected to the controller 95 is a user interface 96 including a keyboard for a step manager to perform a command input operation or the like to manage the cleaning apparatus 10, and a display which displays the operational states of the cleaning apparatus 10 in a visible form.

The controller 95 is connected with a memory unit 97 which has stored therein control programs for accomplishing various processes to be executed by the cleaning apparatus 10 under the control of the controller 95, and programs (i.e., recipes) for allowing individual components of the cleaning apparatus 10 to execute processes according to the invention process conditions. The recipes may be stored on a hard disk, a semiconductor memory or the like, or may be stored in a computer readable portable storage medium, such as CD-ROM or DVD-ROM, which is to be set at a predetermined position in the memory unit 97.

As an arbitrary recipe is called from the memory unit 97 and executed by the controller 95 in response to an instruction or so from the user interface 96 as needed, a desired process is executed in the cleaning apparatus 10 under the control of the controller 95.

Figure 4:
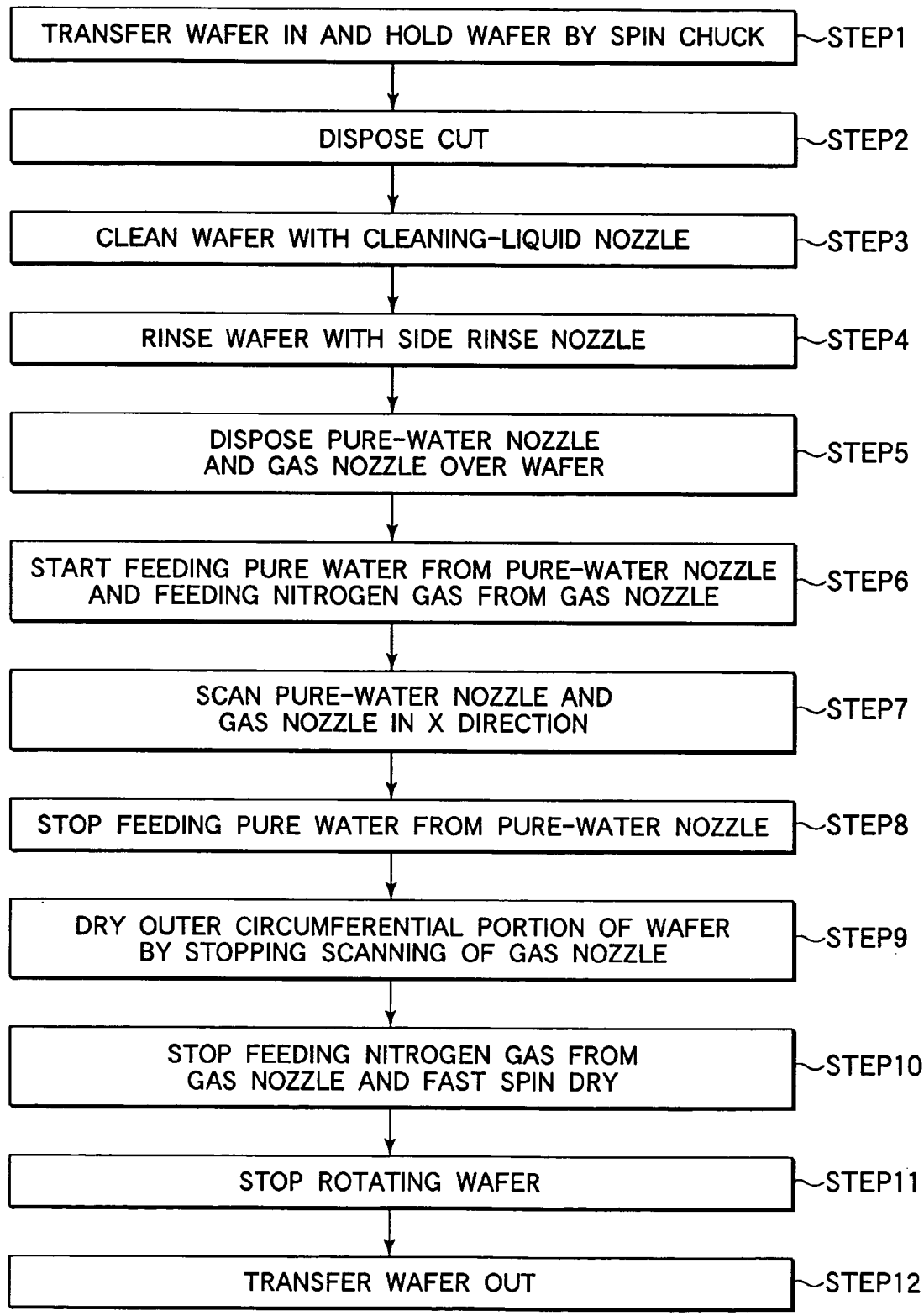
[FIG. 4] A flowchart illustrating process steps for a wafer W in the cleaning apparatus.

Process steps for a wafer W in the cleaning apparatus 10 configured in the above-described manner will be explained referring to a flowchart illustrated in FIG. 4 and diagrams explanatorily showing process steps for a wafer W illustrated in FIGS. 5A to 5H. Note that the side rinse nozzles 13, 14 are shown only in FIGS. 5C and 5D, and the gas nozzle 16 and the pure-water nozzle 17 are not shown in FIG. 5C.

First, the cup 12 is placed at the lower level position, and the plate member 76 is lifted upward by the lift mechanism 77 to press the abutment jigs 78 against the holding members 75, bringing about a state where the outer circumferential ends of the holding members 75 are moved outward and downward. The shutter 92 is opened to open the window 91. An unillustrated wafer transfer arm holding a wafer W is moved into the housing 90 through the window 91 to transfer the wafer W onto the chuck plate 71. After the wafer transfer arm is moved out of the housing 90, the plate member 76 is lifted down to separate the abutment jigs 78 away from the holding members 75, and the wafer W is held by the holding members 75 (step 1). Thereafter, the cup 12 is moved to the upper level position.

Figure 5A:
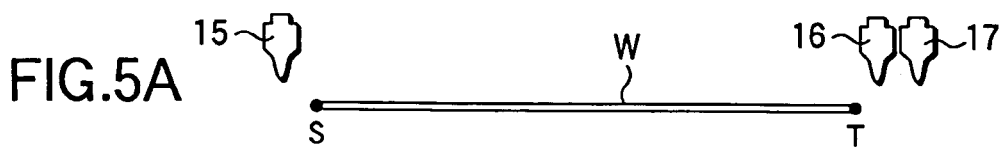
[FIG. 5A] A diagram exemplarily illustrating a process step for the wafer W.
Figure 5B:
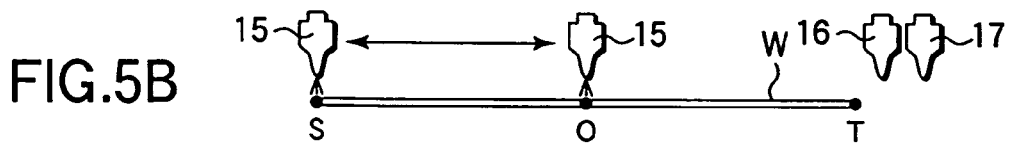
[FIG. 5B] A diagram exemplarily illustrating a process step for the wafer W.

As shown in FIG. 5A, let a point S be the edge of the wafer W which is on the retreat position side of the cleaning-liquid nozzle 15, and a point T be the edge of the wafer W which is on the retreat position side of the gas nozzle 16 and the pure-water nozzle 17. The cleaning-liquid nozzle 15 is moved from the retreat position outside the cup 12 to a predetermined height position of the wafer W held by the spin chuck 11 (step 2). Next, as shown in FIG. 5B, the surface of the wafer W is cleaned by spraying the 2-fluid cleaning liquid onto the surface of the wafer W from the cleaning-liquid nozzle 15 while causing the cleaning-liquid nozzle 15 to scan in the X direction between the edge (point S) of the wafer W and the edge (point T) or between the center (point O) and the edge (point S) with the wafer W being rotated at a predetermined speed (step 3).

Figure 5C:
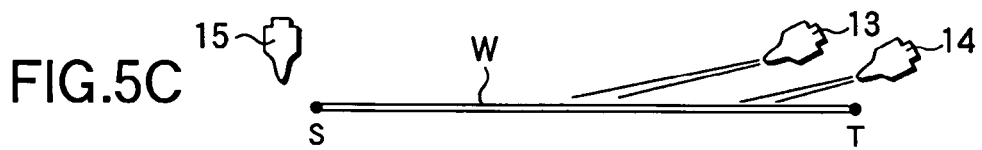
[FIG. 5C] A diagram exemplarily illustrating a process step for the wafer W.

Next, as shown in FIG. 5C, spraying the 2-fluid cleaning liquid from the cleaning-liquid nozzle 15 is stopped (at which time it is preferable that the cleaning-liquid nozzle be on the point S side), and the cleaning-liquid nozzle 15 is moved to the retreat position outside the cup 12. The number of rotations of the wafer W is made lower than that at the time of the cleaning process (at the time of processing with the cleaning-liquid nozzle 15), and the rinse liquid is fed to the surface of the wafer W from the side rinse nozzles 13, 14 to rinse the surface of the wafer W (step 4). In the rinse process, it is preferable that the number of rotations of the wafer W should be set in such a way that a liquid film remains on the entire surface of the wafer W when feeding the pure water from the side rinse nozzles 13, 14 is stopped after elapsing of a predetermined time.

Figure 5D:
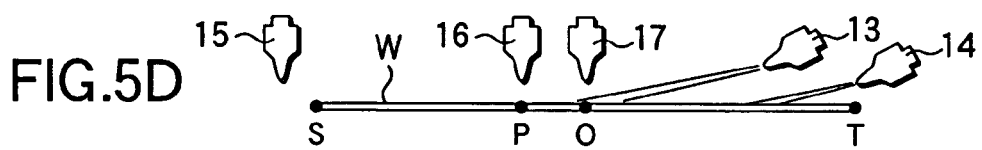
[FIG. 5D] A diagram exemplarily illustrating a process step for the wafer W.

During the rinse process, as shown in FIG. 5D, the gas nozzle 16 is moved to a predetermined height position above a point at an adequate distance from the center (point O) in the center portion of the wafer W, e.g., at the point P apart from the center point O of the wafer W on the point S side by 10 to 50 mm, and the pure-water nozzle 17 is moved to a predetermined height position above the center (point O) of the wafer W (step 5).

The point P is set to a point at which the nitrogen gas injected from the gas nozzle 16 does not splash the pure water sprayed from the pure-water nozzle 17. Setting the position of the point P is to set the distance between the gas nozzle 16 and the pure-water nozzle 17. As will be described later, the distance between the gas nozzle 16 and the pure-water nozzle 17 is set in such a way that when the pure-water nozzle 17 is caused to scan toward the periphery from the center of the wafer W while spraying pure water from the pure-water nozzle 17, the nitrogen gas is fed to a portion whose which starts to be dried by spin-off of the pure water on the wafer W by the centrifugal force.

Figure 5E:
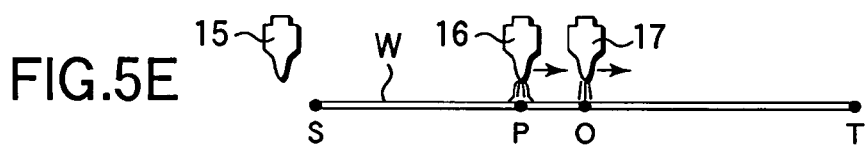
[FIG. 5E] A diagram exemplarily illustrating a process step for the wafer W.

Next, feeding pure water to the surface of the wafer W from the side rinse nozzles 13, 14 is stopped, followed by a dry process for the wafer W. In the dry process, as shown in FIG. 5E, first, the number of rotations of the wafer W is preferably set equal to or greater than that at the time of the rinse process (but is desirable to be smaller than that at the time of the cleaning process), and spraying pure water from the pure-water nozzle 17 is started at substantially the same time injection of the nitrogen gas from the gas nozzle 16 is started (step 6). As a liquid film should be formed outward of the position of the pure-water nozzle 17, it is preferable to set the spray amount of the pure water from the pure-water nozzle 17 smaller than the spray amount of the pure water from the side rinse nozzles 13, 14.

Figure 5F:
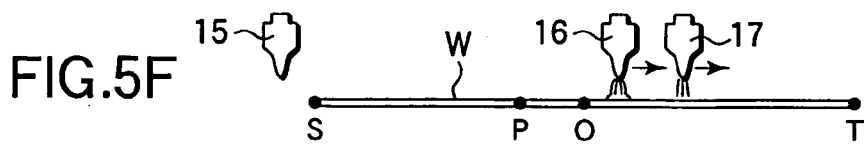
[FIG. 5F] A diagram exemplarily illustrating a process step for the wafer W.

Next, as shown in FIG. 5F, the pure-water nozzle 17 is caused to scan toward the point T on the retreat position side of the pure-water nozzle 17 at a predetermined speed while spraying the pure water from the pure-water nozzle 17. In parallel to that, the gas nozzle 16 is caused to scan toward the point T, passing through the center (point O) of the wafer W, in such a way as to follow up the pure-water nozzle 17 while injecting the nitrogen gas water from the gas nozzle 16 (step 7). In other words, the step 7 is to move the gas feed point for feeding the nitrogen gas to the wafer W to the center (point O) of the wafer W, and then to move the point toward the periphery from the center (point O) of the wafer W in an area radially inward of the pure-water feed point for supplying the pure water to the wafer W while moving the pure-water feed point toward the periphery of the wafer W.

When scanning of the pure-water nozzle 17 from the center of the wafer W toward the periphery is started, the liquid film gradually disappears, due to the centrifugal force, from the center of the wafer W where feeding of the pure water no longer takes place, starting drying the wafer W. As the centrifugal force applied to the liquid film is weak at the center portion of the wafer W, the dry speed is slow. Because the nitrogen gas is fed to near the center of the wafer W, however, the center portion of the wafer W which starts being dried first is not likely to be exposed to air. This suppresses generation of water marks originating from oxidation of the surface of the wafer W. As the gas nozzle 16 is caused to scan in such a way as to feed the nitrogen gas to the portion to start being dried in step 7, it is possible to suppress generation of water marks on the entire wafer W.

The speed at which the pure water fed to the wafer W is spun off the wafer W by the centrifugal force (the speed of the pure water moving over the wafer W) becomes faster at the outer circumferential portion of the wafer W than at the center portion thereof. It is therefore preferable to make the scan speed of the gas nozzle 16 faster at the outer circumferential portion of the wafer W than at the center portion thereof so as not to avoid collision with the pure-water nozzle 17. Accordingly, the portion of the surface of the wafer W which starts being dried is promptly exposed to the nitrogen gas, thus making it possible to suppress generation of water marks.

Figure 5G:
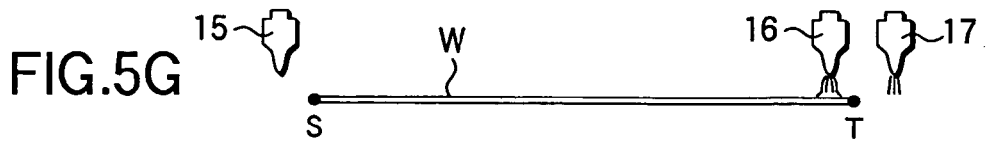
[FIG. 5G] A diagram exemplarily illustrating a process step for the wafer W.

When the pure-water nozzle 17 comes off the periphery of the wafer W this way, delivering the pure water from the pure-water nozzle 17 is stopped (step 8). When the gas nozzle 16 reaches near the periphery of the wafer W as shown in FIG. 5G, on the other hand, it is preferable that the gas nozzle 16 should be stopped there for a predetermined time, e.g., several seconds, to dry the outer circumferential portion of the wafer W (step 9). This can make drying of the outer circumferential portion of the wafer W with the nitrogen gas dominant over centrifugal-force originated spin dry of the liquid droplets, thus ensuring suppression of generation of water marks near the periphery of the wafer W.

Figure 5H:
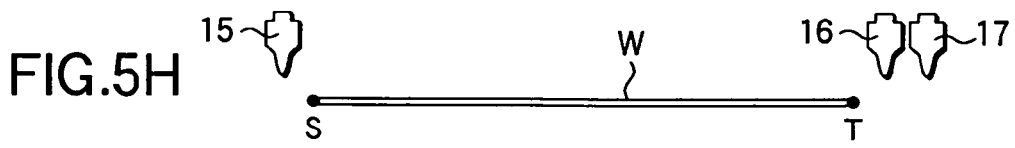
[FIG. 5H] A diagram exemplarily illustrating a process step for the wafer W.

Subsequently, when the gas nozzle 16 comes off the periphery of the wafer W, as shown in FIG. 5H, injection of the nitrogen gas from the gas nozzle 16 i stopped, and the wafer W is rotated faster for a predetermined time than the speed at the time of feeding an inactive gas to carry out final spin dry (step 10). Thereafter, the rotation of the wafer W is stopped (step 11). This completes a sequence of cleaning, rinse and dry processes for the wafer W.

The above-described cleaning method for a wafer W can make the total process time shorter than the conventional cleaning method as will be illustrated later by an example. There also is such an effect that the throughput of the cleaning apparatus 10 can be improved.

When the spin dry is completed, the pure-water nozzle 17 and the gas nozzle 16 are retreated outside the cup 12. Thereafter, the wafer W is transferred out of the housing 90 in reverse procedures to the procedures in which the wafer W was transferred into the housing 90 and was supported on the chuck plate 71 previously (step 12).

The drying method used in the cleaning method is suitably employed particularly when drying of a wafer W progresses as pure water is spun off outside mainly by centrifugal force, i.e., when the surface of the wafer W is hydrophobic. Its example is when the wafer W is a bare wafer. The method can also be adapted to a case where various films and circuits are formed on the surface of the wafer W which has a hydrophobic portion and a hydrophilic portion.

Next, an explanation will be given of an example and comparative examples in a case where a bare wafer is processed by a 2-fluid cleaning liquid. Recipes of various cleaning processes are shown in Table 1, Table 2, and Table 3. The recipe shown in Table 1 is a conventionally well-known cleaning process (Comparative Example 1) of performing initiation of the rotation of a wafer in step 1, a cleaning process by spraying a 2-fluid cleaning liquid from the cleaning-liquid nozzle 15 in step 2, a rinse process by feeding pure water to the wafer from the side rinse nozzles 13, 14 in step 3, spin dry by high-speed rotation in step 4, and stopping of the rotation of the wafer in step 5.

The recipe shown in Table 2 is a cleaning process (Comparative Example 2) of performing initiation of the rotation of a wafer in step 1, a cleaning process by spraying a 2-fluid cleaning liquid from the cleaning-liquid nozzle 15 in step 2, a rinse process of reducing the number of rotations of the wafer and spraying pure water from the side rinse nozzles 13, 14 in step 3, spin dry by medium-speed rotation in step 4, spin dry by high-speed rotation in step 5, and stopping of the rotation of the wafer in step 6.

The recipe shown in Table 3 is a cleaning method according to the invention, and is a cleaning method (Example) of performing initiation of the rotation of a wafer in step 1, a cleaning process by spraying a 2-fluid cleaning liquid from the cleaning-liquid nozzle 15 in step 2, a rinse process of reducing the number of rotations of the wafer and feeding pure water to the wafer from the side rinse nozzles 13, 14 in step 3, spin dry by rotating the wafer at a medium speed and feeding the pure water and the nitrogen gas from the pure-water nozzle 17 and the gas nozzle 16 in step 4, spin dry by rotating the wafer at a faster speed than the number of rotations at the time of feeding the nitrogen gas in step 5, and stopping of the rotation of the wafer in step 6.

Figure 6A:
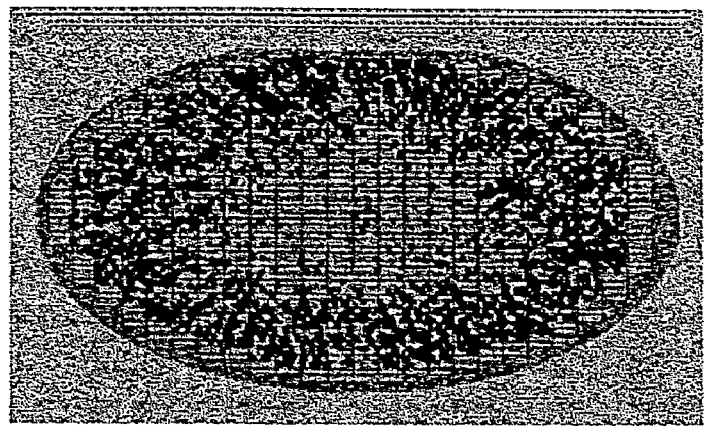
[FIG. 6A] A diagram showing a result of observation of water marks on a wafer by a cleaning method of Comparative Example 1.
Figure 6B:
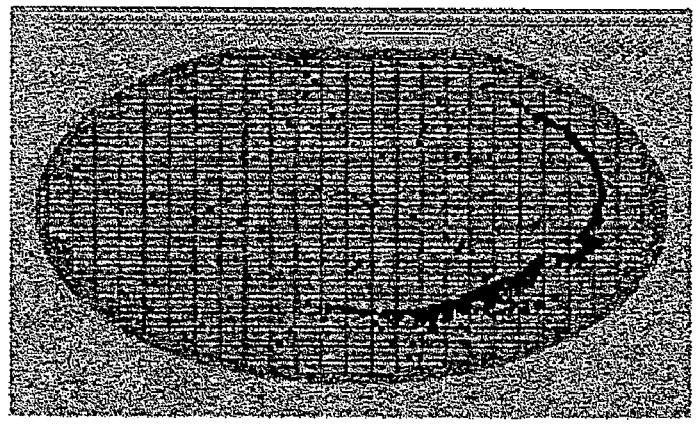
[FIG. 6B] A diagram showing a result of observation of water marks on a wafer by a cleaning method of Comparative Example 2.
Figure 6C:
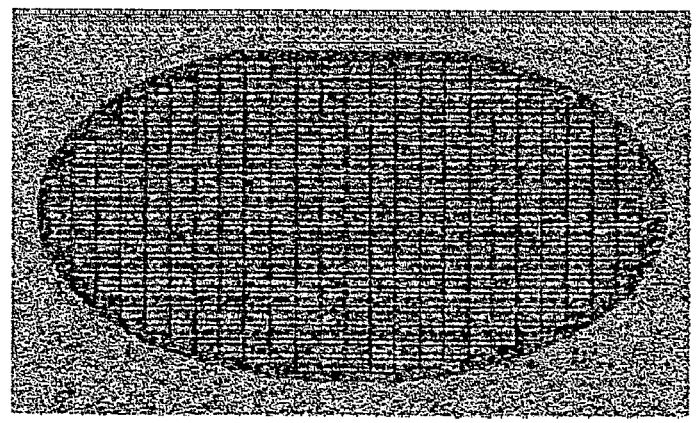
[FIG. 6C] A diagram showing a result of observation of water marks on a wafer by a cleaning method of an embodiment.

FIGS. 6A to 6C show observation results of water marks in those cleaning methods. As shown in FIG. 6A, it was confirmed that water marks (black spots in each of FIGS. 6A to 6C) were generated on the entire wafer in the cleaning method of Comparative Example 1. As shown in FIG. 6B, it was confirmed that lots of water marks were generated particularly on the peripheral portion of the wafer in the cleaning method of Comparative Example 2. As shown in FIG. 6C, however, water marks were hardly observed according to the cleaning method of the Example, and it was confirmed that a good cleaned surface was obtained. In the Example, the rotational acceleration of the wafer W was reduced in the step 4. The slow acceleration in this manner makes it possible to slow down spin-off of the pure water, thus ensuring effective feeding of the nitrogen gas to a portion where drying starts. This also contributes to prevention of generation of water marks in the Example.

From Tables 1 to 3, process time is 44 seconds in Comparative Example 1, 46 seconds in Comparative Example 2, and 39 seconds in the Example. It was also confirmed that the use of the cleaning method of the present invention brings about an effect of improving the throughput of the cleaning apparatus 10.

TABLE 1

| Step | time (second) | Number of Rotations of Wafer (rpm) | Rotaion Acceleration (rpm/sec) | Using nozzle |
|---|---|---|---|---|
| 1 | 1 | 0 | 1000 | |
| 2 | 10 | 1000 | 1000 | cleaning-liquid nozzle |
| 3 | 10 | 1000 | 1000 | side rinse nozzle |
| 4 | 20 | 3000 | 1000 | |
| 5 | 3 | 0 | 1000 | |

TABLE 2

| Step | time (second) | Number of Rotations of Wafer (rpm) | Rotaion Acceleration (rpm/sec) | Using nozzle |
|---|---|---|---|---|
| 1 | 1 | 0 | 1000 | |
| 2 | 10 | 1000 | 1000 | cleaning-liquid nozzle |
| 3 | 8 | 300 | 3000 | side rinse nozzle |
| 4 | 4 | 1000 | 300 | |
| 5 | 20 | 3000 | 100 | |
| 6 | 3 | 0 | 1000 | |

TABLE 3

| Step | time (second) | Number of Rotations of Wafer (rpm) | Rotaion Acceleration (rpm/sec) | Using nozzle |
|---|---|---|---|---|
| 1 | 1 | 0 | 1000 | |
| 2 | 10 | 1000 | 1000 | cleaning-liquid nozzle |
| 3 | 5 | 300 | 1000 | side rinse nozzle |
| 4 | 10 | 300 | 100 | pure-water nazzle+gas nozzle |
| 5 | 10 | 3000 | 1000 | |
| 6 | 3 | 0 | 1000 | |

While the embodiment of the invention has been explained above, the invention is not limited to such an embodiment. For example, in the foregoing description, the gas nozzle 16 and the pure-water nozzle 17 are structured in such a manner as to be drivable independently, but structured in such a manner that the gas nozzle 16 and the pure-water nozzle 17 are caused to scan integrally as the gas nozzle 16 and the pure-water nozzle 17 are arranged at an appropriate distance therebetween (e.g., 10 to 50 mm as mentioned above) in the X direction and attached to the distal end of the second nozzle arm 52. Accordingly, the third nozzle arm 53 and a drive mechanism associated therewith are not required, which can simplify the structure of the cleaning apparatus.

Further, if a nitrogen gas is not fed to the cleaning-liquid nozzle 15, the cleaning-liquid nozzle 15 can spray only pure water, so that the cleaning-liquid nozzle 15 can be used in place of the pure-water nozzle 17. In this case, the pure-water nozzle 17 may be omitted. In this case, the cleaning-liquid nozzle 15 and the gas nozzle 16 may be arranged at a predetermined interval therebetween in the X direction, and attached to the first nozzle arm 51 holding the cleaning-liquid nozzle 15. This can make the structure of the cleaning apparatus simpler.

In the foregoing explanation, the cleaning-liquid nozzle 15, the gas nozzle 16, and the pure-water nozzle 17 are caused to scan linearly in the X direction, but a structure that those nozzles pass through the center of the wafer W and are rotatable in such a manner as to describe an arc over the wafer W may be employed.

Although the gas nozzle 16 is caused to scan as to follow the pure-water nozzle 17 in the foregoing explanation, the scan method of the gas nozzle 16 is not limited to this type. FIGS. 7A to 7I represent explanatory diagrams exemplarily showing another scan method of the gas nozzle 16. Because the operation of the pure-water nozzle 17 in FIGS. 7A to 7I is the same as the operation explained referring to FIGS. 5A to 5H, the explanation for the operation of the pure-water nozzle 17 will be omitted. Because FIGS. 7A to 7E are the same as FIGS. 5A to 5E, the explanation for the operation of the gas nozzle 16 in FIGS. 7A to 7E will be likewise omitted. That is, the feature of the scan method lies in the operation of the gas nozzle 16 in FIGS. 7F to 7I.

Figure 7A:
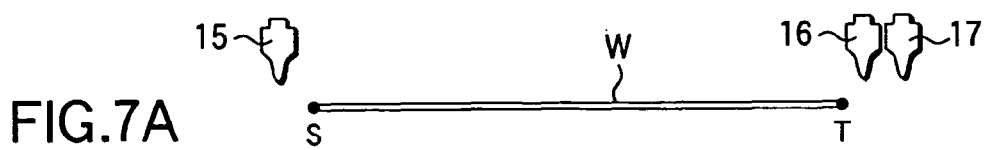
[FIG. 7A] A diagram exemplarily illustrating another process step for the wafer W.
Figure 7B:
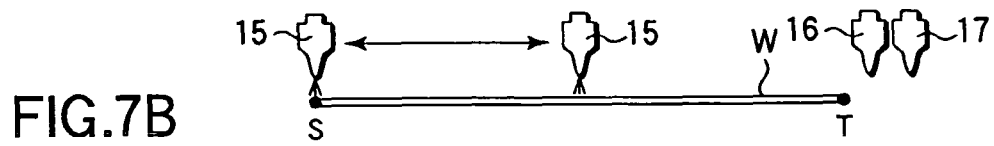
[FIG. 7B] A diagram exemplarily illustrating another process step for the wafer W.
Figure 7C:
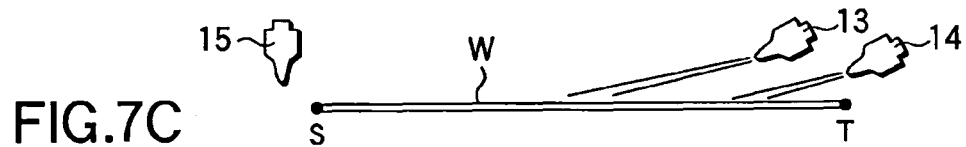
[FIG. 7C] A diagram exemplarily illustrating another process step for the wafer W.
Figure 7D:
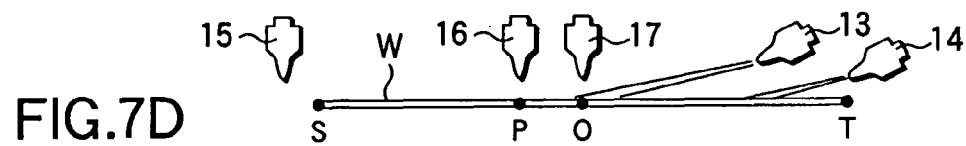
[FIG. 7D] A diagram exemplarily illustrating another process step for the wafer W.
Figure 7E:
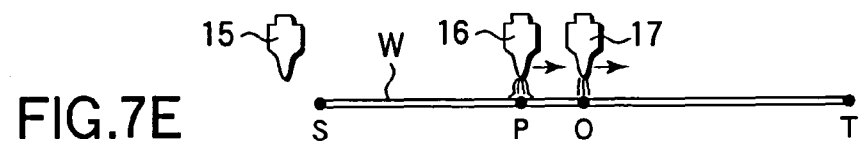
[FIG. 7E] A diagram exemplarily illustrating another process step for the wafer W.
Figure 7F:
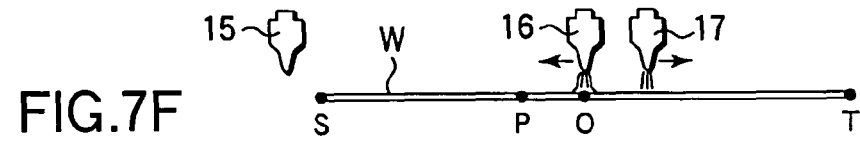
[FIG. 7F] A diagram exemplarily illustrating another process step for the wafer W.
Figure 7G:
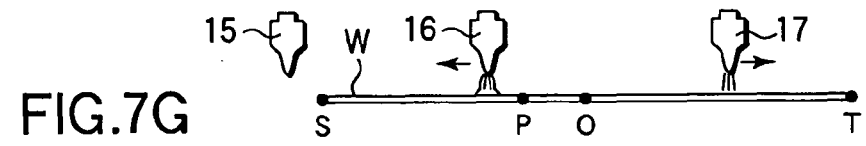
[FIG. 7G] A diagram exemplarily illustrating another process step for the wafer W.
Figure 7H:
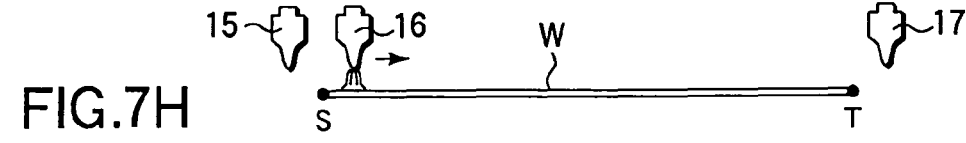
[FIG. 7H] A diagram exemplarily illustrating another process step for the wafer W.
Figure 7I:
[FIG. 7I] A diagram exemplarily illustrating another process step for the wafer W.

At the time of transition to the state in FIG. 7F from the state in FIG. 7E, after the gas nozzle 16 is caused to scan from a point P to a point O while injecting a nitrogen gas from the gas nozzle 16, the gas nozzle 16 returns from the point O to the point P, passes through the point P, and is caused to scan toward a point S of the periphery of the wafer W on the retreat position side of the cleaning-liquid nozzle 15 as shown in FIG. 7G. At this time, the gas nozzle 16 is set in such a manner as to be located inward of the pure-water nozzle 17 in the radial direction of the wafer W. Subsequently, as shown in FIG. 7H, the gas nozzle 16 is stopped at the peripheral portion of the wafer W for a predetermined time to dry out the outer circumferential portion of the wafer W after which the gas nozzle 16 is moved to the predetermined retreat position as shown in FIG. 7I.

Even this method can suppress generation of water marks on the wafer W. By shifting the direction in which the pure-water nozzle 17 is caused to scan from the center of the wafer W toward the periphery and the direction in which the gas nozzle 16 is caused to scan from the center of the wafer W toward the periphery (FIGS. 7F to 7I correspond to a reversed case), it is possible to enhance the degree of freedom for the speed controls of the pure-water nozzle and the gas nozzle while avoiding collision of the pure-water nozzle 17 and the gas nozzle 16 with each other. Even in consideration of the necessity of returning the gas nozzle 16 from the point S to the point T after injection of the nitrogen gas from the gas nozzle 16 is stopped, the throughput of the entire cleaning process can be improved.

The above-described embodiments are intended to clarify the technical contents of the invention, and the invention should not be construed as being limited such specific examples only, but can be modified and worked out in various manners within the spirit of the invention and the described scope of the claims.

INDUSTRIAL APPLICABILITY

The invention is suitable for a cleaning process for semiconductor wafers, and is suitable particularly for a cleaning process for a bare wafer having a hydrophobic face.

The invention claimed is:

1. A substrate cleaning method comprising:
performing a cleaning process on a target substrate while feeding a cleaning liquid onto the substrate; and
performing a dry process on the target substrate after the cleaning process,
wherein the dry process comprises,
rotating the target substrate in a horizontal state during a predetermined period,
starting feeding of a rinse liquid onto a surface of the target substrate at a first time point within the predetermined period, while setting a liquid feed point where the rinse liquid is supplied onto the target substrate, at a center of the target substrate,
starting feeding of an inactive gas onto the surface of the target substrate at or before the first time point within the predetermined period, while setting a gas feed point where the inactive gas is supplied onto the target substrate at a gas start position 10 to 50 mm distant from the center of the target substrate,
feeding the rinse liquid onto the surface of the target substrate during a period from the first time point to a second time point within the predetermined period, while moving the liquid feed point radially outward from the center of the target substrate to an intermediate position on the substrate,
feeding the inactive gas onto the surface of the target substrate during the period from the first time point to the second time point, while moving the gas feed point radially inward from the gas start position to the center of the target substrate,
feeding the rinse liquid onto the surface of the target substrate during a period from the second time point to a third time point within the predetermined period, while moving the liquid feed point radially outward from the intermediate position to a periphery of the target substrate, and
feeding the inactive gas onto the surface of the target substrate during the period from the second time point to the third time point and a period from the third time point to a fourth time point within the predetermined period, while moving the gas feed point radially outward from the center of the target substrate to the periphery of the target substrate, such that the gas feed point is kept located radially inward of the liquid feed point during the period from the second time point to the third time point.

2. The substrate cleaning method according to claim 1, wherein said starting of feeding a rinse liquid and said starting of feeding an inactive gas are performed at substantially the same time.

3. The substrate cleaning method according to claim 1, wherein the gas feed point is moved at a higher speed at the periphery of the target substrate than at the center thereof.

4. The substrate cleaning method according to claim 1, wherein the method further comprises a rinse process, including feeding the rinse liquid onto the surface of the target substrate for a predetermined time while rotating the target substrate in a horizontal state, between the cleaning process and the dry process, and rotating the target substrate during feeding of the inactive gas with a higher rotational speed than in the rinse process.

5. The substrate cleaning method according to claim 1, wherein the method further comprises a rinse process, including feeding the rinse liquid onto the surface of the target substrate for a predetermined time while rotating the target substrate in a horizontal state, between the cleaning process and the dry process, wherein an amount of the rinse liquid fed onto the surface of the target substrate is smaller in the dry process than in the rinse process.

6. The substrate cleaning method according to claim 1, wherein the method further comprises a rinse process, including feeding the rinse liquid onto the surface of the target substrate for a predetermined time while rotating the target substrate in a horizontal state, between the cleaning process and the dry process, wherein a film of the rinse liquid is present on the surface of the target substrate when the dry process is started.

7. The substrate cleaning method according to claim 1, wherein the liquid feed point and the gas feed point are moved in different directions during the period from the second time point to the third time point.

8. The substrate cleaning method according to claim 1, wherein the surface of the target substrate comprises a hydrophobic portion.

9. The substrate cleaning method according to claim 1, wherein the liquid feed point and the gas feed point are moved in the same direction.

10. A substrate cleaning method comprising:
performing a cleaning process on a target substrate while feeding a cleaning liquid onto the substrate; and
performing a dry process on the target substrate after the cleaning process, wherein the dry process comprises,
rotating the target substrate in a horizontal state during a predetermined period, starting feeding of a rinse liquid onto a surface of the target substrate at or before a first time point within the predetermined period, while setting a liquid feed point where the rinse liquid is supplied onto the target substrate, at a center of the target substrate,
starting feeding of an inactive gas onto the surface of the target substrate at or before the first time point within the predetermined period, while setting a gas feed point where the inactive gas is supplied onto the target substrate at a gas start position 10 to 50 mm distant from the center of the target substrate,
feeding the rinse liquid on to the surface of the target substrate during a period from the first time point to a second time point within the predetermined period, while moving the liquid feed point radially outward from the center of the target substrate to an intermediate position on the target substrate,
feeding the inactive gas onto the surface of the target substrate during the period from the first time point to the second time point, while moving the gas feed point radially inward from the gas start position to the center of the target substrate, feeding the rinse liquid onto the surface of the target substrate during a period from the second time point to a third time point within the predetermined period, while moving the liquid feed point radially outward from the intermediate position to a periphery of the target substrate, feeding the inactive gas onto the surface of the target substrate during the period from the second time point to the third time point and a period from the third time point to a fourth time point within the predetermined period, while moving the gas feed point radially outward from the center of the target substrate to the periphery of the target substrate, such that the gas feed point is kept located radially inward of the liquid feed point during the period from the second time point to the third time point, and rotating the substrate without feeding either the rinse liquid or the inactive gas onto the surface of the target substrate for a predetermined time after the fourth time point, with a higher rotational speed than a rotational speed of the target substrate at a time of feeding the inactive gas.

11. The substrate cleaning method according to claim 10, wherein the gas feed point is moved at a higher speed at the periphery of the target substrate than at the center thereof during the periods from the second time point to the fourth time point.

12. The substrate cleaning method according to claim 10, wherein the method further comprises a rinse process, including feeding the rinse liquid onto the surface of the target substrate for a predetermined time while rotating the target substrate in a horizontal state, between the cleaning process and the dry process, and rotating the target substrate during feeding of the inactive gas with a higher rotational speed than in the rinse process.

13. The substrate cleaning method according to claim 10, wherein the method further comprises a rinse process, including feeding the rinse liquid onto the surface of the target substrate for a predetermined time while rotating the target substrate in a horizontal state, between the cleaning process and the dry process, wherein an amount of the rinse liquid to be fed onto the surface of the target substrate is smaller in the dry process than in the rinse process.

14. The substrate cleaning method according to claim 10, wherein the method further comprises a rinse process, including feeding the rinse liquid onto the surface of the target substrate for a predetermined time while rotating the target substrate in a horizontal state, between the cleaning process and the dry process, and wherein a film of the rinse liquid is present on the surface of the target substrate when the dry process is started.

15. The substrate cleaning method according to claim 10, wherein the liquid feed point and the gas feed point are moved in different directions during the period of the second time point to the third time point.

16. The substrate cleaning method according to claim 10, wherein the surface of the target substrate comprises a hydrophobic portion.

17. The substrate cleaning method according to claim 10, wherein the liquid feed point and the gas feed point are moved in the same direction.

18. A computer readable storage medium storing instructions which run on a computer to control a substrate cleaning apparatus to conduct a substrate cleaning method comprising:

performing a cleaning process on a target substrate while feeding a cleaning liquid onto the substrate; and performing a dry process on the target substrate after the cleaning process, wherein the dry process comprises, rotating the target substrate in a horizontal state during a predetermined period, starting feeding of a rinse liquid onto a surface of the target substrate at a first time point within the predetermined period, while setting a liquid feed point where the rinse liquid is supplied onto the target substrate, at a center of the target substrate, starting feeding of an inactive gas onto the surface of the target substrate at the first time point within the predetermined period, while setting a gas feed point where the inactive gas is supplied onto the target substrate at a gas start position 10 to 50 mm distant from the center of the target substrate, feeding the rinse liquid onto the surface of the target substrate during a period from the first time point to a second time point within the predetermined period, while moving the liquid feed point radially outward from the center of the target substrate to an intermediate position on the target substrate, feeding the inactive gas onto the surface of the target substrate during the period from the first time point to the second time point, while moving the gas feed point radially inward from the gas start position to the center of the target, substrate, feeding the rinse liquid onto the surface of the target substrate during a period from the second time point to a third time point within the predetermined period, while moving the liquid feed point radially outward from the intermediate position to a periphery of the target substrate, and feeding the inactive gas onto the surface of the target substrate during the period from the second time point to the third time point and a period from the third time point to a fourth time point within the predetermined period, while moving the gas feed point radially outward from the center of the target substrate to the periphery of the target substrate, such that the gas feed point is kept located radially inward of the liquid feed point during the period from the second time point to the third time point.

19. A computer readable storage medium storing instructions which run on a computer to control a substrate cleaning apparatus to conduct a substrate cleaning method comprising:

performing a cleaning process on a target substrate while feeding a cleaning liquid onto the substrate; and performing a dry process on the target substrate after the cleaning process, wherein the dry process comprises, rotating the target substrate in a horizontal state during a predetermined period, starting feeding of a rinse liquid onto a surface of the target substrate at a first time point within the predetermined period, while setting a liquid feed point where the rinse liquid is supplied onto the target substrate, at the center of the target substrate, starting feeding of an inactive gas onto the surface of the target substrate at the first time point within the predetermined period, while setting a liquid feed point where the inactive gas is supplied onto the target substrate at a gas start position 10 to 50 mm distant from the center of the target substrate, feeding the rinse liquid onto the surface of the target substrate during a period from the first time point to a second time point within the predetermined period, while moving the liquid feed point radially outward from the center of the target substrate to an intermediate position on the target substrate, feeding the inactive gas onto the surface of the target substrate during the period from the first time point to the second time point, while moving the gas feed point radially inward from the gas start position to the center of the target substrate, feeding the rinse liquid onto the surface of the target substrate during a period from the second time point to a third time point within the predetermined period, while moving the liquid feed point radially outward from the intermediate position to a periphery of the target substrate, and feeding the inactive gas onto the surface of the target substrate during the period from the second time point to the third time point and a period from the third time point to a fourth time point within the predetermined period, while moving the gas feed point radially outward from the center of the target substrate to the periphery of the target substrate, such that the gas feed point is kept located radially inward of the liquid feed point during the period from the second time point to the third time point, and rotating the substrate without feeding either the rinse liquid or the inactive gas on the surface of the target substrate for a predetermined time after the fourth time point, with a higher rotational speed than a rotational speed of the target substrate at a time of feeding the inactive gas.

* * * * *